United States Patent [19]

Cronin et al.

[11] Patent Number: 5,091,289
[45] Date of Patent: Feb. 25, 1992

[54] PROCESS FOR FORMING MULTI-LEVEL COPLANAR CONDUCTOR/INSULATOR FILMS EMPLOYING PHOTOSENSITIVE POLYIMIDE POLYMER COMPOSITIONS

[75] Inventors: John E. Cronin, Milton; Carter W. Kaanta, Colchester; Rosemary A. Previti-Kelly, Richmond; James G. Ryan, Essex Junction, all of Vt.

[73] Assignee: International Business Machines Corporation, Armonk, N.Y.

[21] Appl. No.: 516,394

[22] Filed: Apr. 30, 1990

[51] Int. Cl.$^5$ .............................................. G03F 7/26
[52] U.S. Cl. .................................... 430/312; 430/313; 430/314; 430/317; 156/660; 437/235
[58] Field of Search .............. 430/312, 313, 314, 316, 430/317; 156/643, 659.1, 660, 661.1; 437/225, 228, 229, 235

[56] References Cited

U.S. PATENT DOCUMENTS

| | | | |
|---|---|---|---|
| 4,328,262 | 5/1982 | Kurahashi et al. | 427/93 |
| 4,347,306 | 8/1982 | Takeda et al. | 430/312 |
| 4,621,045 | 11/1986 | Goodner | 430/311 |
| 4,629,777 | 12/1986 | Pfeifer | 528/353 |
| 4,656,116 | 4/1987 | Rohde et al. | 430/197 |
| 4,657,832 | 4/1987 | Pfeifer | 430/18 |
| 4,665,007 | 5/1987 | Cservak et al. | 430/317 |
| 4,698,295 | 10/1987 | Pfeifer et al. | 430/325 |
| 4,735,891 | 4/1988 | Budde et al. | 430/312 |
| 4,786,569 | 11/1988 | Rohde et al. | 430/14 |
| 4,789,648 | 12/1988 | Chow et al. | 437/225 |
| 4,842,991 | 6/1989 | Brighton | 430/316 |
| 4,997,746 | 3/1991 | Greco et al. | 430/317 |

FOREIGN PATENT DOCUMENTS 0223920 6/1987 European Pat. Off. .

OTHER PUBLICATIONS

Chiu, G. T. et al., "Process For Multilayer Metal Technology," IBM Tech. Discl. Bull., vol. 25, No. 10 (Mar. 1983) pp. 5309-5314.

Pfeifer, J. et al., "Direct Photoimaging of Fully Imidized Solvent-Soluble Polyimides", Second International Conference on Polyimides, Mid-Hudson Section SPE, Ellenville, N.Y. (Oct. 30-Nov. 1, 1985), pp. 130-150.

Primary Examiner—Marion E. McCamish
Assistant Examiner—Kathleen Duda
Attorney, Agent, or Firm—William D. Sabo

[57] ABSTRACT

Disclosed is a process for producing multi-level conductor/insulator films on a processed semiconductor substrate having a conductor pattern. The insulator layers, each comprise a photosensitive polyimide polymer composition, and this allows the desired wiring channels and stud vias to be formed directly in the insulator layers, without the use of separate masking layers and resulting image transfer steps, thus providing a less cumbersome and costly process.

13 Claims, 3 Drawing Sheets

5,091,289

PROCESS FOR FORMING MULTI-LEVEL COPLANAR CONDUCTOR/INSULATOR FILMS EMPLOYING PHOTOSENSITIVE POLYIMIDE POLYMER COMPOSITIONS

BACKGROUND OF THE INVENTION

1. Technical Field

This invention relates to the manufacture of VLSI semiconductor chips, boards and assemblies, and, more particularly, to a process for forming multi-level coplanar metal insulator films on a substrate.

2. Description of the Prior Art

In the field of VLSI semiconductor chip processing, multi-level metal patterns are used to interconnect devices. One technique for accomplishing this is disclosed in IBM Tech. Discl. Bull., Vol. 25, No. 10 (Mar. 1983), pp. 5309-5314, where a first metal pattern is formed in an insulator layer. An insulator layer is deposited, and a series of holes are etched through this layer in locations where interconnections (or stud vias) are desired. The holes are filled with metal, excess metal is lifted off, and another insulator layer is deposited; this layer is patterned, and metal is deposited in these openings, thus making contact with the first metal pattern. This process is cumbersome and costly to carry out, however, as it involves several sequences of masking and etching steps.

A simpler approach is shown in U.S. Pat. No. 4,789,648, issued to Chow, et al. on Dec. 6, 1988, which includes the following steps: depositing an insulator layer over an underlying insulator layer containing a metal pattern; applying an etch stop layer; defining holes in the etch stop; depositing another insulator layer; etching openings (or wiring channels) in the upper insulator layer in alignment with the holes in the etch stop, and continuing the etching into the first insulator layer to form via holes; overfilling the channels and via holes with metal; and then removing the excess metal to form a coplanar metal/insulator surface. While this process is less complicated than that disclosed in the article discussed above, nevertheless, it still involves two sequences of masking and etching steps to form the via holes and the wiring channels.

Another conventional technique, known as the pillar process, is exemplified in U.S. Pat. No. 4,621,045, issued to Goodner on Nov. 4, 1986, in which a conductive pillar is provided in an insulator layer to connect two layers of metal. This process also has a high degree of complexity, however, with multiple masking and etching sequences.

SUMMARY OF THE INVENTION

Now, in accordance with the present invention, there is provided a less cumbersome process, which employs at least two insulator layers comprising a photosensitive polyimide polymer composition. Openings are formed directly in the insulator layers, without requiring the use of masking layers and pattern transfer steps. The openings which are in at least partial alignment are simultaneously filled with a conductor material, and the material which overlies the upper insulator layer is removed to achieve a coplanar conductor/insulator film. The process steps can be repeated to form additional coplanar conductor/insulator films.

In a preferred embodiment, the process involves forming a multi-level coplanar conductor/insulator film on a substrate by first applying a first layer comprising a photosensitive polyimide polymer composition to the substrate. A develop stop layer is applied to the first layer, and a second layer comprising a photosensitive polyimide polymer composition is applied to the develop stop layer. The second layer is imagewise exposed and developed so as to selectively expose portions of the develop stop layer, and the exposed portions are removed. The first layer is imagewise exposed and developed so as to selectively expose regions of the substrate, the openings formed in the first layer being in alignment with at least a portion of the openings formed in the second layer. A conductor material is deposited on the second layer and in the openings in the first and second layers, and the conductor material which overlies the second layer is then removed to coplanarize the surfaces of the conductor material and the second layer.

The foregoing and other objects, features and advantages of the invention will be apparent from the following more particular description of the preferred embodiments of the invention.

DETAILED DESCRIPTION OF THE PREFERRED EMBODIMENTS

Figure 1:
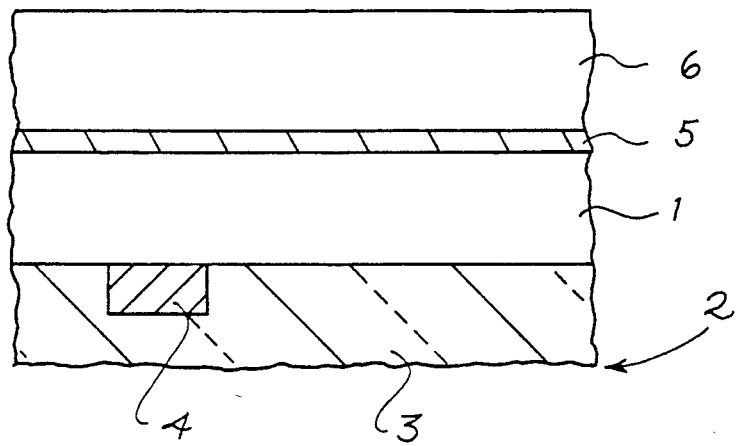
FIGS. 1-8 are cross-sectional views of a semiconductor structure illustrating the structure that results at various stages of the process of a preferred embodiment of the invention.

Referring to FIG. 1, the process starts by applying a first insulator layer 1 to a processed semiconductor substrate, indicated generally by the numeral 2. Typically, the substrate 2 comprises a planarized insulator layer 3 which includes a pattern of conductor material 4. In general, the insulator layer 3 is disposed over an integrated circuit chip, and the conductor material 4 is contact metallurgy to devices (not shown) formed in the chip. Preferably, the first insulator layer 1 is deposited over the substrate 2 by spin application, at about 2000-6000 rpm for about 20-60 seconds, and then baked at a temperature of about 70°-90° C. for about 10-30 minutes. It should be noted that it is also preferred, to improve adhesion, to apply a conventional adhesion promoter, such as 0.1% 3-aminopropyltriethoxysilane (commercially available from Union Carbide under the designation "A1100") in methanol, to the substrate before depositing the first insulator layer 1. In general, the planarized insulator layer 3 commonly comprises silicon dioxide or reflowed phosphosilicate glass, and the conductor material 4 may be, for example, copper-doped aluminum or doped polycrystalline silicon.

Next, a relatively thin layer of develop stop material 5, such as silicon, silicon dioxide, spin-on-glass or polysiloxane, is deposited over the first insulator layer 1. Then, a second insulator layer 6 is deposited over the develop stop layer 5, preferably under the conditions as described above for application of the first insulator layer 1. In general, the first isulator layer 1 is applied to a thickness typically ranging from about 0.2-1 microns, preferably from about 0.6-0.7 microns, while the second insulator layer 6 has a thickness usually ranging from about 0.05-1.2 microns, preferably from about 0.2-0.5 microns. As noted, the develop stop layer is relatively thin, having a thickness generally ranging from about 0.01-0.1 microns, preferably from about 0.025-0.05 microns.

It is an important feature of the invention, that both insulator layers 1 and 6 comprise a photosensitive polyimide polymer composition. Thus, a desired pattern of openings can be formed directly in each of the layers 1 and 6, without requiring application of separate masking layers, followed by image transfer steps. Suitable photosensitive polyimide polymer compositions are disclosed, for example, in U.S. Pat. No. 4,629,777, issued to Pfeifer on Dec. 16, 1986; U.S. Pat. No. 4,657,832, issued to Pfeifer on Apr. 14, 1987; U.S. Pat. No. 4,698,295, issued to Pfeifer, et al. on Oct. 6, 1987; and U.S. Pat. No. 4,656,116, issued to Rohde, et al. on Apr. 7, 1987, the entire disclosures of which are incorporated herein by reference. Preferably, the polymer composition comprises a fully imidized solvent soluble polyimide with a structural unit having the general formula

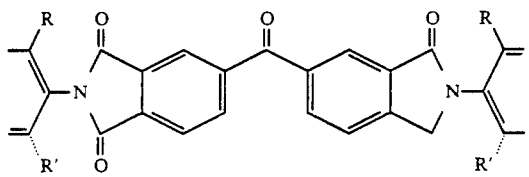

where R represents an aliphatic group, such as methyl, and R' represents an optional aliphatic substituent which may be the same as or different from R, and a suitable solvent for the polymer. (The R' substituent can enhance the photospeed or increase the Tg-value of the polymer.) Such photosensitive polyimide polymer compositions are disclosed in Pfeifer, et al., "Direct Photoimaging of Fully Imidized Solvent-Soluble Polyimides", Second International Conference on Polyimides, Mid-Hudson Section SPE, Ellenville, N.Y. (Oct. 30-Nov. 1, 1985), the entire disclosure of which is incorporated herein by reference. In a particularly preferred embodiment, the "PROBIMIDE 400" series, preferably "PROBIMIDE 408", commercially available from Ciba-Geigy Corp., is employed.

Figure 2:
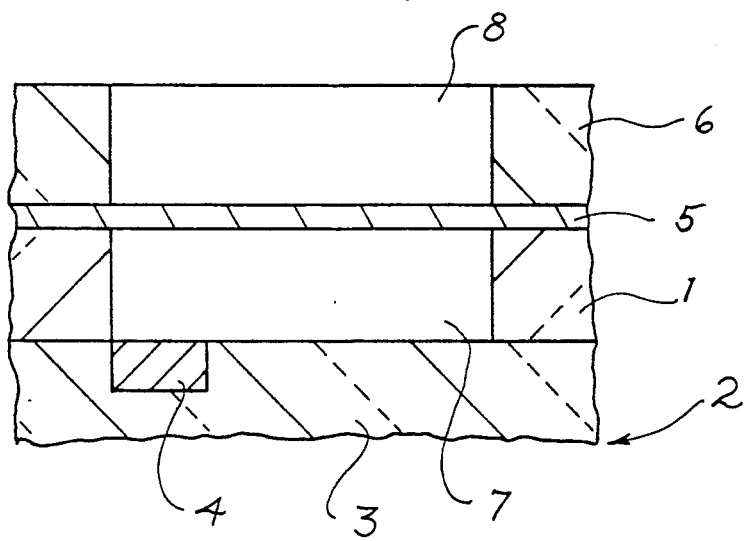

Referring to FIG. 2, the second insulator layer 6 is exposed in a predetermined pattern to radiation, such as UV light, in a conventional fashion. During the exposure step, it should be noted that the first insulator layer 1 is also exposed in the same pattern. In the preferred embodiment, both insulator layers 1 and 6 comprise a photosensitive polyimide polymer composition that is negative-acting, so that the unexposed portions, designated as 7 and 8 respectively, are removable with a suitable developer. It should also be noted that the develop stop layer 5 is selected of a material which is capable of transmitting radiation to the underlying insulator layer 1 in the exposed areas.

Figure 3:
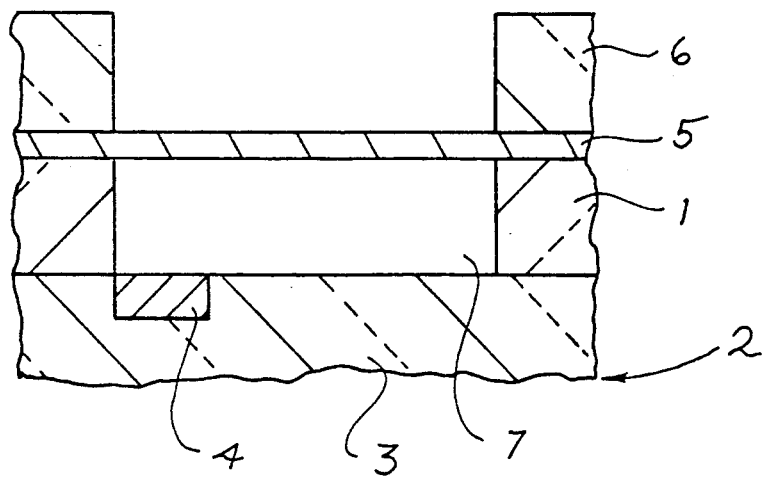

Referring to FIG. 3, following the exposure step, portions of the second insulator layer 6 are removed to selectively expose or reveal portions of the develop stop layer 5. For example, when "PROBIMIDE 408" is used as the photosensitive polyimide polymer composition, the unexposed portions 8 of the second insulator layer 6 are removed, preferably by spraying with a conventional developer, such as, for example, gammabutyrolactone. In general, the development time will depend on the thickness of the second insulator layer 6, as well as other factors known to those skilled in the art. It should be noted that the develop stop layer 5 serves to prevent development of the underlying first insulator layer 1.

Figure 4:
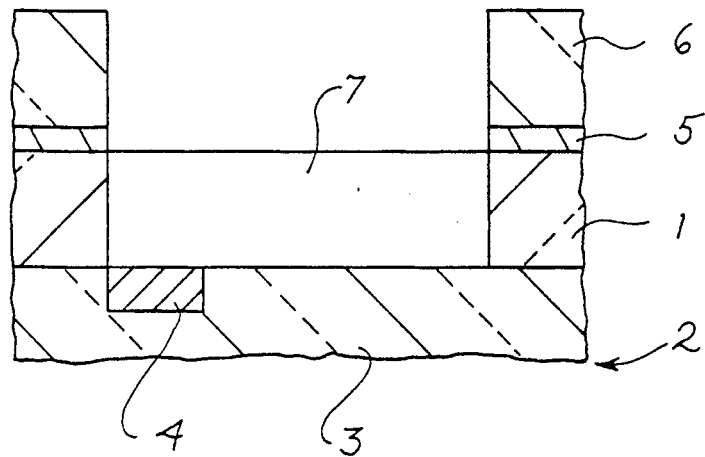
Figure 5:
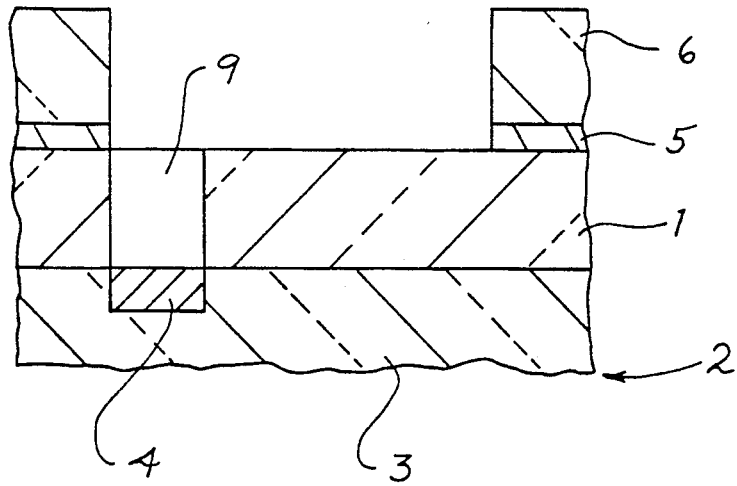
Figure 6:
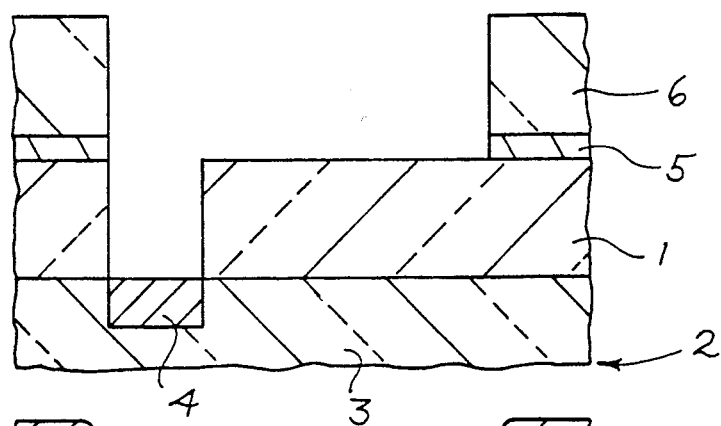

Referring to FIG. 4, the exposed portions of the develop stop layer 5 are then removed, preferably with a wet chemical etchant, such as 20 wt. % KOH/2 vol. % isopropyl alcohol in water. However, dry etching techniques can also be employed, as should be apparent to those skilled in the art. Referring to FIG. 5, the first insulator layer 1 is then exposed in a predetermined pattern to radiation, such as UV light, in a conventional manner. As with the second insulator layer 6, the unexposed portions 9 of the first insulator layer 1 are removed, in the manner as described above, to selectively expose regions of the substrate 2. As shown in FIG. 6, the openings formed in the first insulator layer 1 are in at least partial alignment with those formed in the second insulator layer 6. The openings in the first insulator layer 1 allow contact to be made to the pattern 4 in the substrate 2. The structure, as shown in FIG. 6, allows simultaneous formation of conductor material in the openings in the second insulator layer 6 (i.e., wiring channels) and in the openings in the first insulator layer 1 (i.e., stud vias).

The structure, as shown in FIG. 6, is then subjected to a heating step so as to cure the polyimide layers 1 and 6. Generally, this step is carried out at a temperature of at least about 10° C. above the temperature at which the conductor material 10 is to be applied, as discussed below. Typically, this temperature is at least about 350° C., and is usually within the range of about 350°-450° C., depending upon the conductor material 10 which is employed.

Figure 7:
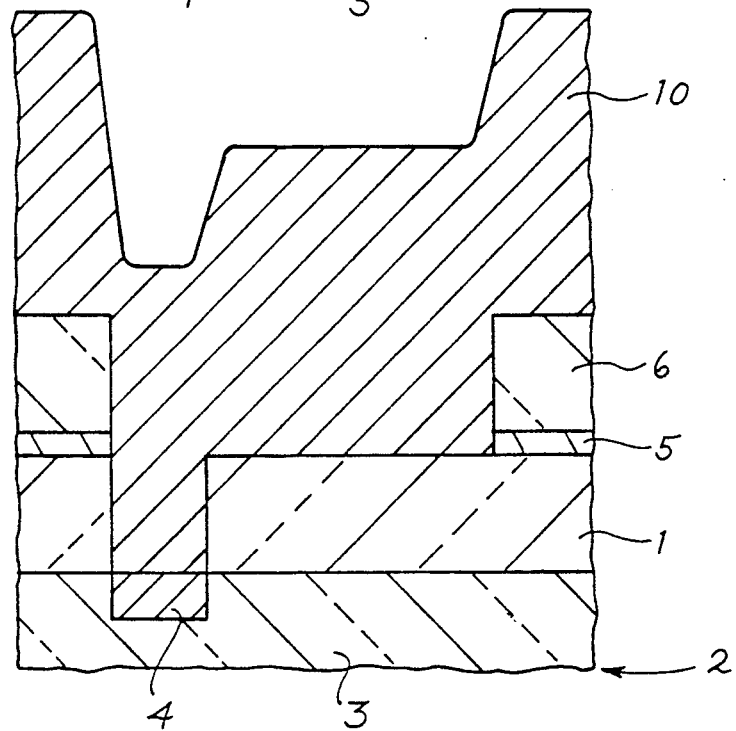

Next, as shown in FIG. 7, the openings in the layers 1 and 6 are overfilled with conductor material 10, preferably metal, for example, aluminum, copper, Al-Cu, Al-Si or tungsten, preferably by physical vapor deposition, such as evaporation or sputtering, chemical vapor deposition or by plating. It should be noted that the thickness of the conductor material 10 is at least as great as the combined thickness of the insulator layers 1 and 6 and the develop stop layer 5.

Figure 8:
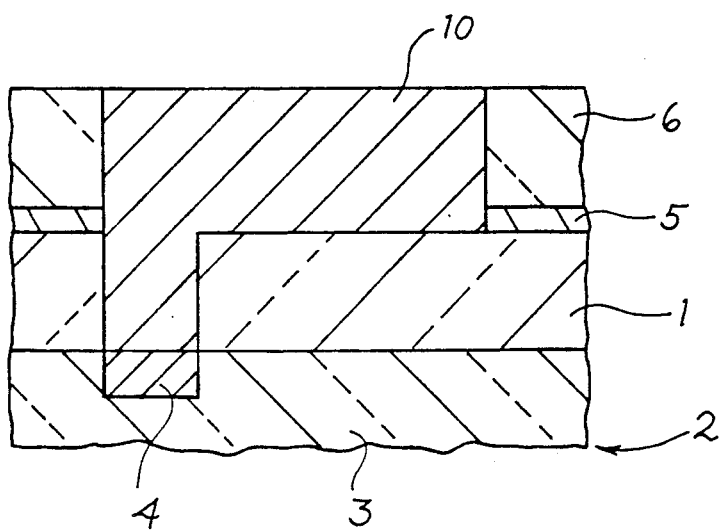

In the next step, as shown in FIG. 8, the conductor material 10, which overlies the second insulating layer 6 is removed so as to coplanarize the surfaces of the conductor material 10 and the second insulator layer 6. A preferred method to accomplish this is by using chemical-mechanical polishing, as taught, for example, in Eur. Pat. Appln., No. 0,223,920, published Jun. 3, 1987, by Beyer, et al., the entire disclosure of which is incorporated herein by reference. That process involves the concurrent chemical and mechanical polishing of an overlying layer to expose the surface of a non-planar underlying layer on which it is formed, one layer of which is a conductive film, and the other, an insulator film. Using a polishing pad and a slurry, the process removes the overlying layer at a faster rate than the underlying layer, until the upper surface of the overlying layer becomes coplanar with that of the underlying layer. As another alternative, coplanarization can be accomplished by standard sacrificial planarization methods, such as etchback, as should be apparent to those skilled in the art.

If the conductor layer 10 is the final metal level of the semiconductor structure, a final passivation insulator is applied over the substrate. Otherwise, if additional levels of metallization are to be formed, then the steps as described above are repeated for each level desired.

Various modifications can be made in the process, as will be apparent to those skilled in the art. For example, depending upon the choice of material for the develop stop layer 5, the first insulator layer 1 can be imagewise exposed in the second exposure step before the exposed portions of the develop stop layer 5 are removed. As noted above, however, it is generally preferred to first remove the exposed portions of the develop stop layer 5, since generally speaking this will provide a better exposure of the first insulator layer 1.

A sample process flow for this embodiment, prior to application and planarization of metal, is as follows:

Spin apply 0.1% 3-aminopropyltriethoxysilane (commercially available from Union Carbide under the designation "A1100") in methanol to a processed semiconductor substrate containing a pattern of metallization;

Spin apply "PROBIMIDE 408" at 500 rpms, then hold at 4,000 rpms for 25 sec.;

Bake at 80° C. for 20 min.;

Apply Si by chemical vapor deposition;

Spin apply "PROBIMIDE 408" and bake as above;

Expose to UV light (270 mj at 365 nm);

Develop second "PROBIMIDE 408" layer with a 45 sec. spray of gammabutyrolactone at 500 rpms;

Rinse with a 20 sec. spray of xylene at 500 rpms;

Dry with $N_2$;

Etch Si by immersion in 20 wt. % KOH/2 vol. % isopropyl alcohol in water;

Expose to UV light (270 mj at 365 nm);

Develop, rinse and dry as above; and

Ramp cure to 350° C.

As such, the present invention provides multi-level coplanar conductor/insulator films, by forming the desired channels and stud vias directly in the insulator layers, without the need for separate masking layers and image transfer steps. Accordingly, the need for resist stripping operations, which can damage the patterns formed in the insulator layers, is also avoided.

While the invention has been particularly shown and described with reference to preferred embodiments thereof, it will be understood by those skilled in the art that various changes in form and details may be made without departing from the spirit and scope of the invention.

What is claimed is:

1. A process for forming multi-level coplanar conductor/insulator films on a substrate having a conductor pattern, comprising the steps of:
    applying a first layer comprising a photosensitive polyimide polymer composition to said substrate;
    applying a develop stop layer to said first layer, said develop stop layer being comprised of a material which is capable of transmitting radiation to said first layer;
    applying a second layer comprising a photosensitive polyimide polymer composition to said develop stop layer;
    imagewise exposing said first and second layers and then developing said second layer so as to selectively expose portions of said develop stop layer;
    removing said exposed portions of said develop stop layer;
    imagewise exposing and developing said first layer so as to selectively expose regions of said substrate, the openings formed in said first layer being in alignment with at least a portion of the openings formed in said second layer;
    depositing a conductor material on said second layer and in said openings in said first and second layers; and
    removing said conductor material which overlies said second layer to coplanarize the surfaces of conductor material and said second layer.

2. The process of claim 1, wherein said photosensitive polyimide polymer composition comprises a fully imidized solvent soluble polyimide with a structural unit having the general formula

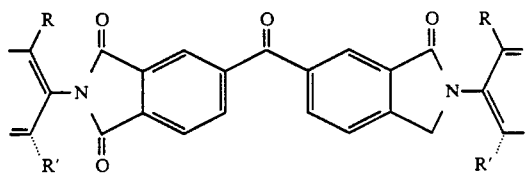

where R represents an aliphatic group, and R' represents an optional aliphatic substituent which may be the same as or different from R, and a solvent.

3. The process of claim 1, wherein said develop stop layer comprises a material selected from silicon, silicon dioxide, spin-on-glass and a polysiloxane.

4. The process of claim 1, wherein said conductor is a metal selected from aluminum, copper, Al-Cu, Al-Si and tungsten.

5. The process of claim 1, wherein said first layer is imagewise exposed before said exposed portions of said develop stop layer are removed.

6. The process of claim 1, wherein said first layer has a thickness ranging from about 0.2 to about 1 microns; said second layer has a thickness ranging from about 0.05 to about 1.2 microns; and said develop stop layer has a thickness ranging from about 0.01 to about 0.1 microns.

7. The process of claim 1, wherein said conductor material which overlies said second layer is removed by using chemical-mechanical polishing.

8. The process of claim 1, wherein said steps are repeated to form additional coplanar conductor/insulator films.

9. A process for forming multi-level coplanar metal/insulator films on a substrate having a conductor pattern, comprising the steps of:
    depositing a first layer comprising a photosensitive polyimide polymer composition over said substrate;
    depositing a develop stop layer over said first layer, said develop stop layer being comprised of a material which is capable of transmitting radiation to said first layer;
    depositing a second layer comprising a photosensitive polyimide polymer composition over said develop stop layer;
    imagewise exposing said first and second layers;
    spraying said substrate with a developer so as to remove portions of said second layer and to selectively expose portions of said develop stop layer;
    etching to remove said exposed portions of said develop stop layer;
    imagewise exposing said first layer;
    spraying said substrate with a developer so as to remove portions of said first layer and to selectively expose regions of said substrate, the openings formed in said first layer being in alignment with at least a portion of the openings formed in said second layer;
    depositing a metal over said second layer and in said openings in said first and second layers; and removing said metal which overlies said second layer by using chemical-mechanical polishing to coplanarize the surfaces of metal and said second layer.

10. The process of claim 9, wherein said photosensitive polyimide polymer composition comprises a fully imidized solvent soluble polyimide with a structural unit having the general formula

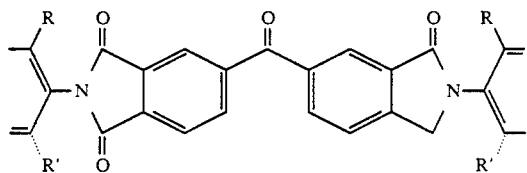

where R represents an aliphatic group, and R' represents an optional aliphatic substituent which may be the same as or different from R, and a solvent.

11. The process of claim 10, wherein said develop stop layer comprises a material selected from silicon, silicon dioxide, spin-on-glass and a polysiloxane; and said metal is selected from aluminum, copper, Al-Cu, Al-Si and tungsten.

12. The process of claim 11, wherein said first layer has a thickness ranging from about 0.6 to about 0.7 microns; said second layer has a thickness ranging from about 0.2 to about 0.5 microns; and said develop stop layer has a thickness ranging from about 0.025 to about 0.05 microns.

13. The process of claim 12, wherein said steps are repeated to form additional coplanar metal/insulator films.

* * * * *